United States Patent
Oku et al.

(10) Patent No.: US 6,497,944 B1
(45) Date of Patent: Dec. 24, 2002

(54) LIGHT-EMITTING DEVICE COMPRISING A GALLIUM-NITRIDE-GROUP COMPOUND-SEMICONDUCTOR

(75) Inventors: Yasunari Oku, Fukuoka (JP); Hidenori Kamei, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/219,428

(22) Filed: Dec. 23, 1998

(30) Foreign Application Priority Data

Dec. 26, 1997 (JP) .............................. 9-359616

(51) Int. Cl.⁷ .............................. H01L 33/00
(52) U.S. Cl. .................. 428/212; 428/213; 428/690; 428/698; 428/699; 428/917; 257/94; 257/101; 257/103; 313/506
(58) Field of Search ................. 428/690, 698, 428/699, 917, 212, 213, 336; 313/498, 499, 506; 372/46; 257/94, 96, 97, 101, 102, 103

(56) References Cited

U.S. PATENT DOCUMENTS 5,587,593 A * 12/1996 Koide et al. ................. 257/94
5,903,017 A * 5/1999 Itaya et al. ................. 257/190
6,060,730 A * 5/2000 Tsutsui ........................ 257/103
6,320,207 B1 * 11/2001 Furukawa et al. .......... 257/101

FOREIGN PATENT DOCUMENTS

| JP | 5-283745 | 10/1993 |
|----|----------|---------|
| JP | 06268259 | 9/1994 |

* cited by examiner

*Primary Examiner*—Marie Yamnitzky
(74) *Attorney, Agent, or Firm*—McDermott, Will & Emery

(57) ABSTRACT

In the light-emitting gallium-nitride-group compound semiconductor devices using an insulating substrate, the operating voltage is lowered and at the same time the occurrence of cracks during crystal growth is suppressed, resulting in an improved manufacturing yield rate. The device includes a stacked structure of an n-type layer, a light-emitting layer and a p-type layer formed in the foregoing order on an insulating substrate, and an n-side electrode formed on the surface of the n-type layer. The n-type layer is a laminate layer composed of, in the order from the substrate, a first n-type layer and a second n-type layer having a carrier concentration higher than that of the first n-type layer. As the contact resistance between the n-type layer and the n-side electrode formed thereon is reduced, the operating voltage of a light-emitting device is lowered, and the power consumption decreased.

2 Claims, 1 Drawing Sheet

(PRIOR ART)

LIGHT-EMITTING DEVICE COMPRISING A GALLIUM-NITRIDE-GROUP COMPOUND-SEMICONDUCTOR

BACKGROUND OF THE INVENTION

The present invention relates to a light-emitting device made with gallium-nitride-group compound-semiconductor such as light-emitting diode, laser diode, etc.

Gallium-nitride-group compound-semiconductors have been increasingly used as the semiconductor material for the visible light-emitting devices and for use in the electronic devices of high operating temperature. The development has been significant in the field of blue and green light-emitting diodes.

In manufacturing the gallium-nitride-group compound-semiconductor devices, an insulating sapphire is generally used as the substrate for growing semiconductor film. Such devices are different from the light-emitting devices where semiconductor substrates other than gallium-nitride-group type substrates, such as, for example GaAs or InGaP, are utilized. Specifically, those using an insulating substrate like the present sapphire have the n-side and p-side electrodes formed in one side of the substrate wherein the semiconductor film has been formed, because the electrodes can not be provided from the substrate.

Meanwhile, in the recent manufacture of light-emitting devices, including those using the sapphire substrate, the growing of gallium-nitride-group semiconductor thin film by a metal organic CVD method has become a main stream procedure. In the procedure, a substrate is placed in a reaction tube, and metal organic compound gas (tri-methyl-gallium [TMG], tri-methyl-aluminum [TMA], tri-methyl-indium [TMI], etc.) are supplied therein as the material gas for the Group III element, and ammonia, hydrazine, etc. as the material gas for the Group V element, while maintaining the substrate at a high temperature 900° C.–1100° C., to have an n-type layer, a light-emitting layer and a p-type layer grown on the substrate in a stacked structure. After the layers are grown and formed, the p-type layer and the light-emitting layer are partially etched off to have the n-type layer exposed, and then an n-side electrode and a p-side electrode are formed on the surface of exposed n-type layer and the p-type layer, respectively, for example by a deposition method.

Most of the recent light-emitting devices have the above described double-hetero-structure, fabricated by stacking the thin films of gallium-nitride-group compound-semiconductor on a sapphire substrate. FIG. 2 shows a cross sectional structure of a prior art light-emitting device of gallium-nitride-group compound- semiconductor.

In FIG. 2, a buffer layer 12, an n-type layer 13 of gallium-nitride (GaN), a light-emitting layer 14 of indium-gallium-nitride (InGaN), a p-type clad layer 15 of aluminum-gallium-nitride (AlGaN) and a p-type contact layer 16 of GaN are stacked on a sapphire substrate 11. A p-side electrode 17 is formed on the p-type contact layer 16, and an n-side electrode 18 is formed on an exposed surface of the n-type layer 13 provided by partially removing the following three layers, p-type contact layer 16, p-type clad layer 15 and light-emitting layer 14. The n-type electrode 18 is normally made with aluminum (Al), titanium (Ti), gold (Au), or such other metals. The light-emitting gallium-nitride-group compound-semiconductor devices of the above structure have been disclosed in, for example, Japanese Patent Publication No. 6-268259.

In the prior art light-emitting gallium-nitride-group compound-semiconductor devices of the above structure, the n-type layer 13 is formed of a gallium-nitride-group compound-semiconductor doped with n-type impurities such as silicon (Si), germanium (Ge). More specifically, during the growth of the n-type layer of gallium-nitride-group compound-semiconductor by said metal organic CVD method, silane, mono-methyl-silane, etc. are supplied, together with the material gas, as material gas for Si, or germane, mono-methyl-germane, etc. as material gas for Ge. The carrier concentration of n-type layer 13 may be controlled by adjusting the flow rate of the material gas for n-type impurities.

In the gallium-nitride-group compound-semiconductor, the n-type layer may also be formed by intentionally not doping the n-type impurities, because it exhibits the n-type property even without the n-type impurities being doped therein.

If in the light-emitting gallium-nitride-group compound-semiconductor devices the efficiency of light-emission is to be maintained high, the operating voltage needs to be lowered. In order to reduce the operating voltage, the series resistance in respective layers of compound-semiconductor stacked on the substrate 11 and the contact resistance with electrode have to be made low.

An effective means for reducing the series resistance of n-type layer 13 and the contact resistance with the n-side electrode 18 is to increase the doping quantity of n-type impurities during growth of n-type layer 13 by metal organic CVD. However, when doping quantity of the n-type impurities is increased, a strain can be generated in the grown n-type layer 13, which increases and readily leads to cracks at the n-type layer 13. If there are cracks in the n-type layer 13, an even emission of light may not be obtained over the entire surface, and the reliability of a light-emitting device may be degraded.

On the other hand, if priority is placed on suppression of cracks at n-type layer 13, the n-type layer 13 needs to be grown and formed in a reduced doping quantity of the n-type impurities. In this case, however, it becomes difficult to reduce the contact resistance with n-side electrode 18. If, in compensation of the above, the layer thickness of the n-type Is layer 13 is increased up-to about μm (e.g. 16, 17 μm) in order to reduce the series resistance of a light-emitting device, cracks are easily induced like in the earlier described case. In addition, it needs a longer time for growing the crystal, which is an additional disadvantage in the manufacture thereof.

As described in the above, if in a light-emitting gallium-nitride-group compound-semiconductor device the doping quantity of n-type impurities is increased for lowering the operating voltage, or the layer thickness is increased, the occurrence of cracks may be unavoidable, which leads to a degraded light-emitting capability and a deteriorated manufacturing yield rate.

The problems expected to be solved by the present invention with a light-emitting gallium-nitride-group compound-semiconductor device using an insulating substrate are; first to reduce the operating voltage, and second to suppress the occurrence of cracks during growth for an improved manufacturing yield rate.

SUMMARY OF THE INVENTION

A novel invented light-emitting gallium-nitride-group compound-semiconductor device of the present invention has a stacked structure comprising an n-type layer, a light-emitting layer and a p-type layer formed one after the other on an insulating substrate. In accordance with the present invention, the p-type layer and light-emitting layer are partially removed from the surface of the stacked structure formed on the substrate such that the n-type layer is exposed, and then an electrode is formed on the exposed surface of the n-type layer. The n-type layer contains, in order from the substrate, at least a first n-type layer and a second n-type layer whose carrier concentration is higher than that of the first n-type layer. The electrode is disposed on the second n-type layer.

With the above structure, a light-emitting gallium-nitride-group compound-semiconductor device is formed, in which the operating voltage is low and the manufacturing yield rate is high.

DETAILED DESCRIPTION OF THE INVENTION

Figure 1:
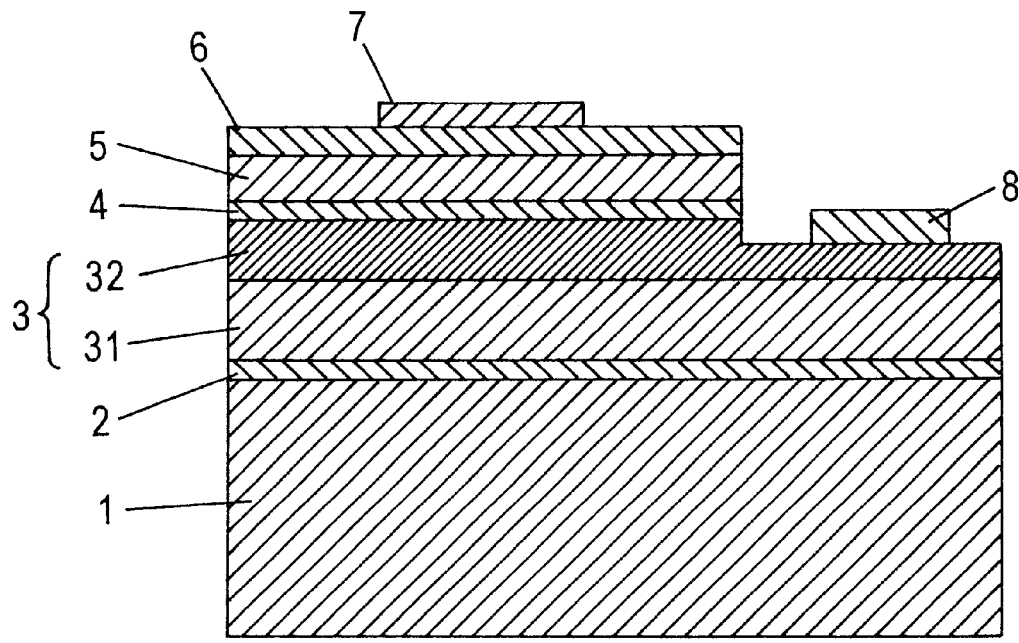
FIG. 1 is a cross sectional view shows the structure of a light-emitting gallium-nitride-group compound-semiconductor device in accordance with an exemplary embodiment of the present invention.
Figure 2:
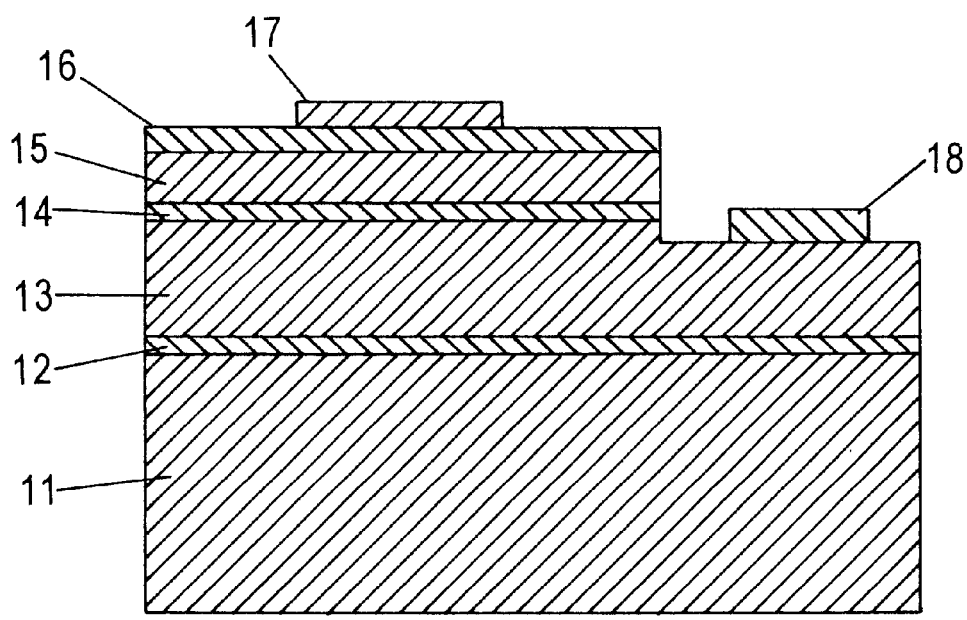
FIG. 2 is a cross sectional view shows one of the structures of a device of a light-emitting gallium-nitride-group compound-semiconductor in a prior art.

A first exemplary embodiment of the light-emitting gallium-nitride-group compound semiconductor device of the present invention has a stacked structure comprising an n-type layer, a light-emitting layer and a p-type layer formed one after the other on an insulating substrate. The p-type layer and light emitting layer are partially removed from the surface of the stacked structure formed on the substrate to expose the n-type layer, and an electrode is formed on the exposed surface of n-type layer. The n-type layer comprises, in the order from the substrate, at least a first n-type layer and a second n-type layer whose carrier concentration is higher than that of the first n-type layer. The electrode is disposed on the second n-type layer. As a result of the present invention, the operating voltage of the light-emitting device is lowered through a reduced contact resistance between the n-type layer and the n-side electrode.

In a second embodiment of the light-emitting device of the present invention the carrier concentration of the first n-type layer is set within a range $1 \times 10^{16}-2 \times 10^{18}$ cm$^{-3}$, and the carrier concentration of the second n-type layer within a range $2 \times 10^{18}-1 \times 10^{19}$ cm$^{-3}$. As a result, the occurrence of cracks is suppressed and the contact resistance between the n-type layer and the electrode is reduced.

In a third embodiment of the light-emitting device of the present invention the thickness of the second n-type layer is smaller than that of the first n-type layer. As such, the occurrence of cracks is suppressed.

In a fourth embodiment of the light-emitting device of the present invention the layer thickness of the first n-type layer is set within a range of 1–5 μm, the thickness of the second n-type layer is set within a range of 0.1–0.5 μm. By specifying a range in the thickness of n-type layer, the occurrence of cracks is effectively suppressed, and the depth of etching can be maintained with a high precision when removing a part of the p-type layer and the light-emitting layer for exposing the surface of the n-type layer.

Next, the exemplary embodiments of the present invention are described with reference to the drawing.

FIG. 1 is a cross sectional view used to show the structure of a light-emitting gallium-nitride-group compound-semiconductor device in accordance with an exemplary embodiment of the present invention.

In FIG. 1, a buffer layer 2 is formed on a substrate 1 made of sapphire. The buffer layer 2 may be formed of GaN, GaAlN, AlN, AlInN, etc. Stacked on the buffer layer 2 are, in the order from the bottom, an n-type layer 3, a light-emitting layer 4, a p-type clad layer 5 and a p-type contact layer 6. The n-type layer 3 has a laminate structure comprising, in the order from the substrate 1, a first n-type layer 31 of lower carrier concentration and a second n-type layer 32 of higher carrier concentration. Si, Ge, etc. may be used as n-type impurities for forming the n-type layer 3.

The light-emitting layer 4 of InGaN may be formed either by doping zinc, Si, etc. for making use of the impurity level; or leaving it as the un-doped, keeping thinner than 10 nm, for making use of the quantum level. "Un-doped" means the one in which neither p-type impurities nor n-type impurities are added during the growth process.

The p-type clad layer 5 can be formed of AlGaN, GaN, AlGaInN, etc. The p-type contact layer 6 may be formed of GaN, InGaN, etc. The p-type impurities to be doped in the p-type clad layer 5 and the p-type contact layer 6 are Mg.

A p-side electrode 7 is provided on the p-type contact layer 6, and an n-side electrode 8 is provided on the second n-type layer 32 among the n-type layers 3. The n-side electrode 8 may be formed of aluminum(Al), titanium(Ti), etc.

As described earlier, if in the manufacture of a light-emitting gallium-nitride-group compound-semiconductor device the doping quantity of n-type impurities in the n-type layer is increased or the thickness of n-type layer is increased for the purpose of lowering the operating voltage, the frequency of the generation of cracks during growing process increases, and the manufacturing yield rate decreases. One of the reasons for the generation of cracks is believed to be attributable to a strain created in the n-type layer grown by doping n-type impurities with high concentration, and the amount of strain increases along with the increasing thickness of the layer.

Namely, in a prior art technology there was a tradeoff between the amount of doping of the n-type impurities and the thickness of n-type layer regarding the occurrence of cracks. When attempting to lower the operating voltage through optimization of the amount of n-type impurities to be doped in the n-type layer and the thickness of the layer. Hence, there was a limitation in the conventional technology. In other words, because there is a tradeoff in the relationship between the doping amount of n-type impurities in the n-type layer and the layer thickness with respect to occurrence of cracks in n-type layer, attempting to lower the operating voltage through the optimization of the foregoing factors has a limitation.

In the present embodiment where the n-type layer 3 has a laminate structure comprising, in the order from the substrate 1, a first n-type layer 31 of lower carrier concentration and a second n-type layer 32 of higher carrier concentration, and the n-side electrode 8 is disposed on the second n-type layer 32, the operating voltage can be lowered while keeping the manufacturing yield rate high. Detailed description is made in the following.

A light-emitting gallium-nitride-group compound-semiconductor device of the present exemplary embodiment is shown in FIG. 1. As stated, the device comprises an n-type layer 3 having a laminate structure comprising, in the order from the substrate 1, a first n-type layer 31 of lower carrier concentration and a second n-type layer 32 of higher carrier concentration. Namely, the first n-type layer 31 of lower carrier concentration is formed on the substrate 1, and then the second n-type layer 32 of higher carrier concentration is formed thereon. The n-side electrode 8 is formed on the second n-type layer 32.

In the above laminate structure where the first n-type layer 31 and the second n-type layer 32, the carrier concentration of respective layers being different, are formed one on the other in the order from the substrate 1, the first n-type layer 31 can be formed thick with the doping quantity of n-type impurities in the first n-type layer 31 decreased for a low carrier concentration. Therefore, both the increase of resistance in the first n-type layer and the occurrence of cracks is suppressed. By disposing the n-side electrode 8 on the second n-type layer 32 which has been formed on the first n-type layer 31 with the n-type impurities doped more than in the first n-type layer 31 for a higher carrier concentration, the contact resistance between the second n-type layer 32 and the n-side electrode 8 is reduced. Therefore, the operating voltage of a light-emitting device is lowered and the power consumption reduced.

As described in the above, each of the respective first and second n-type layers 31, 32 have different carrier concentrations. This enables the optimization in both the lowering of operating voltage and the prevention of cracks. According to the results of experiments, preferred values of carrier concentration have been determined to be as follows.

It is preferred that the carrier concentration of the first n-type layer 31 be within a range of $1 \times 10^{16}$ cm$^{-3}$–$2 \times 10^{18}$ cm$^{-3}$. When the carrier concentration of first n-type layer 31 is lower than $1 \times 10^{16}$ cm$^{-3}$ the series resistance of the first n-type layer 31 itself goes high and the operating voltage of the device tends to go high; on the other hand, when the carrier concentration of first n-type layer 31 is higher than $2 \times 10^{18}$ cm$^{-3}$ it tends to invite the cracks.

It is preferred that the carrier concentration of the second n-type layer 32, whose carrier concentration is higher than that of the first n-type layer 31, is in the range of $2 \times 10^{18}$ cm$^{-3}$–$1 \times 10^{19}$ cm$^{-3}$. When the carrier concentration of second n-type layer 32 is smaller than $2 \times 10^{18}$ cm$^{-3}$ the contact resistance with the n-side electrode 8 can not be reduced low enough. On the other hand, when the carrier concentration of second n-type layer 32 is greater than $1 \times 10^{19}$ cm$^{-3}$ the crystallinity of the layer tends to be degraded. This may deteriorate the crystallinity of light-emitting layer and a p-type layer to be grown thereon, and the light-emitting output can be degraded.

Further, it is preferred that the thickness of second n-type layer 32 has a thickness smaller than that of the first n-type layer 31. Specifically, the thickness of second n-type layer should preferably be within a range of 0.1–0.5 $\mu$m. If it is thinner than 0.1 $\mu$m, it becomes difficult to control the etching depth in the process of partially removing the p-type layer comprising the p-type clad layer 5 and p-type contact layer 6 as well as the light-emitting layer 4 for having the surface of n-type layer 3 exposed. If it is thicker than 0.5 $\mu$m, the crystallinity of second n-type layer 32 is degraded, and the crystallinity of a light-emitting layer 4, a p-type clad layer 5 and a p-type contact layer 6 to be grown on the second n-type layer 32 are also degraded. Thus, the light-emitting output can be degraded.

The thickness of first n-type layer 31 should preferably be within a range 1–5 $\mu$m. If it is thinner than 1 $\mu$m, the series resistance of the device goes high to a raised operating voltage. If the first n-type layer is thicker than 5 $\mu$m, the cracks may readily occur.

EMBODIMENT

An exemplary method for manufacturing an invented light-emitting semiconductor device is described below.

The present exemplary embodiment refers to a method of growing a gallium-nitride-group compound-semiconductor using a metal organic CVD process.

Embodiment 1

Description is made with reference to FIG. 1.

A sapphire substrate 1 having a mirror-polished surface is set on a substrate holder within a reaction tube. The substrate 1 is maintained at 1100° C. on the surface for 10 minutes, and is cleaned to remove organic stains or humidity sticking on the surface by heating the substrate in a hydrogen gas flow.

Then, the surface temperature of substrate 1 is lowered down to 600° C., and a buffer layer 2 of AlN is grown to the thickness of approximately 25 nm by providing nitrogen gas, as the main carrier gas, at 10 liter/min., ammonia at 5 liter/min., a TMA (tri-methyl-aluminum) carrier gas containing tri-methyl-aluminum at 20 cc/min.

The supply of the TMA carrier gas is discontinued and the temperature is raised up-to 1050° C. Then, while continuing the flow of nitrogen gas, as the main carrier gas, at 9 liter/min., and hydrogen gas at 0.95 liter/min., new gases are added, namely, a carrier gas of tri-methyl-gallium(TMG) at 4 cc/min., a 10 ppm SiH4(mono-silane) gas, as the source of Si, at 10 cc/min. for a duration of 60 min. in order to grow a first n-type layer 31 of Si doped GaN in the thickness of approximately 2 $\mu$m. As the result, the carrier concentration of first n-type layer 31 is $1 \times 10^{18}$ cm$^{-3}$.

After the first n-type layer 31 is grown and formed, while keeping the respective flow rates of the main carrier gas and the TMG carrier gas as they are, the flow rate of SiH4 gas alone is modified to 50 cc/min. to be continued for 6 min. in order to grow a second n-type layer 32 of Si doped GaN in the thickness of 0.2 $\mu$m. As the result, the carrier concentration of the second n-type layer 32 is $5 \times 10^{18}$ cm$^{-3}$.

After the second n-type layer 32 is grown and formed, flow of the TMG carrier gas and the SiH4 gas are discontinued, the. surface temperature of substrate 1 is lowered down to 750° C., and new gases are provided; nitrogen gas, as the main carrier gas, at 10 liter/min., a TMG carrier gas at 2 cc/min., and a TMI (tri-methyl-indium) carrier gas at 200 cc/min. for a duration of 30 sec. in order to grow a light-emitting layer 4 of un-doped InGaN in the thickness of approximately 3 nm.

After the light-emitting layer 4 is formed, the TMI carrier gas and the TMG carrier gas are discontinued, the surface temperature of substrate 1 is raised up-to 1050° C., and new gases are provided; nitrogen gas, as the main carrier gas, at 9 liter/ min., hydrogen gas at 0.94 liter/min., a TMG carrier gas at 4 cc/min., a TMA carrier gas at 6 cc/min., a carrier gas for bis-cyclo-pentadienyel-magnesium (Cp$_2$Mg), or Mg source, at 50 cc/ min. for a duration of 4 min. in order to grow a p-type clad layer 5 of Mg doped AlGaN in the thickness of approximately 0.1 $\mu$m.

Then, the TMA carrier gas alone is discontinued, and at 1050° C., new gases are provided, namely, nitrogen gas, as the main carrier gas, at 9 liter/min., hydrogen gas at 0.90 liter/min., a TMG. carrier gas at 4 cc/min., a Cp$_2$Mg carrier gas at 10 cc/min., for a duration of 3 min. in order to grow a p-type contact layer 6 of Mg doped GaN in the thickness of approximately 0.1 μm. After the p-type contact layer 6 is grown, the TMG carrier gas, as a material gas, and ammonia are discontinued. The wafer is then cooled down to room temperature while the flow of nitrogen gas and the hydrogen gas are maintained as is, and then the wafer is taken out from the reaction tube.

On the surface of the stacked layer structure containing a quantum well structure thus formed of gallium-nitride-group compound semiconductor, an $SiO_2$ film is deposited by CVD process. Then, an etching mask is patterned in a certain specific shape by photolithography. The p-type contact layer 6, the p-type clad layer 5 and the light-emitting layer 4 are etched off in part by a reactive ion etching process for a depth of approximately 0.25 μm to have the surface of second n-type layer 32 exposed. On the exposed surface of second n-type layer 32 an n-side electrode 8 of Al is deposited and formed through photolithography and deposition processes. By the same procedure, a p-side electrode 7 of Ni and Au is deposited and formed on the surface of the p-type contact layer 6.

The reverse surface of the sapphire substrate 1 is polished down to approximately 100 μm thick, and separated into chips by scribing. Each of the chips is attached on a stem with the surface having the electrode formed thereon. The respective n-side electrode 8 and p-side electrode 7 on the chip are connected with wire to electrodes of the stem, and the whole structure is resin-molded to complete a light-emitting diode. When the light emitting diode is driven with 20 mA forward current, it emits a blue-violet light of 430 nm wave-length; the forward operating voltage at that time was 3.4 V.

As a comparative specimen 1, a light-emitting diode has been manufactured in the same procedure as in embodiment 1, except that; in the process for growing a first n-type layer 31 and a second n-type layer 32 of embodiment 1, an n-type layer 3 of Si doped GaN having a single layered structure has been grown by providing, at 1050° C., nitrogen gas, or the main carrier gas, at 9 liter/min., hydrogen gas at 0.95 liter/min., a TMG carrier gas at 4 cc/min., SiH4 gas at 10 cc/min., for a duration of 66 min.

In a light-emitting diode manufactured through the procedure of comparative specimen 1, the carrier concentration of the n type layer was $1\times10^{18}$ $cm^{-3}$. When it is driven with 20 mA forward current, it emitted, like that of embodiment 1, blue-violet light of 430 nm wave-length. However, the forward operating voltage at that time was 4.0 V, or 0.6 V higher than in embodiment 1.

Embodiment 2

A light emitting diode has been manufactured in the same procedure as in embodiment 1, except that; in the process for growing a first n-type layer 31 of embodiment 1, a first n-type layer 31 of Si doped GaN has been grown in the thickness of approximately 1 μm, by providing, at 1050° C., nitrogen gas, as the main carrier gas, at 9 liter/min., hydrogen gas at 0.95 liter/min., a TMG carrier gas at 4 cc/min., SiH4 gas at 20 cc/min., for a duration of 30 min. After the first n-type layer 31 is grown and formed, the flow rate of the SiH4 gas alone was modified to 100 cc/min. to be provided by a duration of 3 min., while the respective flow rate of the main carrier gas and the TMG carrier gas have been maintained as they are, in order to grow a second n-type layer 32 of Si doped GaN in the thickness of approximately 0.1 μm.

The carrier concentration in the present exemplary embodiment 2 of the respective first n-type layer 31 and the second n-type layer 32 were $2\times10^{18}$ $cm^{-3}$ and $1\times10^{19}$ $cm^{-3}$. When it is driven with 20 mA forward current, it emits blue-violet light of 430 nm wave-length; and the forward operating voltage at that time was 3.3 V.

As a comparative specimen 2, a light-emitting diode has been manufactured in the same procedure as in embodiment 2, except that; in the process for growing a first n-type layer 31 and a second n-type layer 32 of embodiment 2, an n-type layer of Si doped GaN having a single layered structure has been grown by providing, at 1050° C., nitrogen gas, as the main carrier gas, at 9 liter/min., hydrogen gas at 0.95 liter/min., a TMG carrier gas at 4 cc/min., $SiH_4$ gas at 100 cc/min., for a duration of 33 min.

In a light-emitting diode manufactured through the procedure of comparative specimen 2, the carrier concentration of the n-type layer was $1\times10^{19}$ $cm^{-3}$. When it is driven with 20 mA forward current, it emits, unlike that of embodiment 2, blue-white light. In a microscopic observation conducted to study the state of emitting the light, it has been confirmed that the light was emitted only at a part of the circumferential portion of the n-type electrode. This seems to have been caused by cracks in the n-type layer. The forward operating voltage of the light-emitting diode of comparative specimen 2, when driven with 20 mA forward current, was 4.8 V, or 1.5 V higher than in embodiment 2.

Embodiment 3

A light-emitting diode has been manufactured in the same procedure as in embodiment 1, except that; in the process for growing a first n type layer 31 of embodiment 1, a first n-type layer 31 of Si doped GaN has been grown in the thickness of approximately 5 μm, by providing, at 1050° C., nitrogen gas, as the main carrier gas, at 9 liter/min., hydrogen gas at 0.95 liter/min., a TMG carrier gas at 4 cc/min., $SiH_4$ gas at 1 cc/min., for a duration of 150 min. After the first n-type layer 31 is grown and formed, the flow rate of the $SiH_4$ gas alone was modified to 20 cc/min. to be provided by a duration of 15 min., while the flow rate of the respective main carrier gas and the TMG carrier gas have been maintained as they are, in order to grow a second n-type layer 32 of Si doped GaN in the thickness of approximately 0.5 μm.

The carrier concentration in the present exemplary embodiment 3 of the respective first n-type layer 31 and the second n-type layer 32 were $1\times10^{16}$ $cm^{-3}$ and $2\times10^{18}$ $cm^{-3}$. When it is driven with 20 mA forward current, it emits blue-violet light of 430 nm wave-length; and the forward operating voltage at that time was 3.6 V.

As a comparative specimen 3, a light-emitting diode has been manufactured in the same procedure as in embodiment 3, except that; in the process for growing a first n-type layer 31 and a second n-type layer 32 of embodiment 3, an n-type layer 3 of Si doped GaN having a single layered structure has been grown by providing, at 1050° C., nitrogen gas, as the main carrier gas, at 9 liter/min., hydrogen gas at 0.95 liter/min., a TMG carrier gas at 4 cc/min., $SiH_4$ gas at 1 cc/min., for a duration of 165 min.

In a light-emitting diode manufactured through the procedure of comparative specimen 3, the carrier concentration of the n-type layer was $1\times10^{17}$ $cm^{-3}$. When it is driven with 20 mA forward current, it emitted, like in embodiment 3, blue-violet light of 430 nm wave-length. The forward operating voltage at that time was 4.7 V, or 1.1 V higher than in embodiment 3.

Embodiment 4

A light-emitting diode has been manufactured in the same procedure as in embodiment 1, except that; in the process for growing a first n-type layer 31 of embodiment 1, a first n-type layer 31 of un-doped GaN has been grown in the thickness of approximately 4 μm, by providing, at 1050° C., nitrogen gas, as the main carrier gas, at 9 liter/min., hydrogen gas at 1 liter/min., a TMG carrier gas at 4 cc/min., for a duration of 120 min. After the first n-type layer 31 was grown, a second n-type layer 32 of Si doped GaN has been grown in the thickness of approximately 0.3 μm, by providing, in succession, the main carrier gas at 9 liter/min., hydrogen gas at 0.90 liter/min., a TMG carrier gas at 4 cc/min., and with an addition of $SiH_4$ gas at 100 cc/min., all of which gases are supplied for a duration of 9 min.

The carrier concentration in the present exemplary embodiment 4 of the respective first n-type layer 31 and the second n-type layer 32 were $2\times10^{16}$ cm$^{-3}$ and $1\times10^{19}$ cm$^{-3}$. When it is driven with 20 mA forward current, it emits blue-violet light of 430 nm wave-length; and the forward operating voltage at that time was 3.6 V.

One advantage of the present invention is that the contact resistance between the n-type layer and the n-side electrode formed thereon is lowered by providing an n-type layer stacked on a substrate in a two-layered structure composed of a first n-type layer of smaller carrier concentration and a second n-type layer of greater carrier concentration. As a result, the operating voltage of a light-emitting device is lowered and the power consumption reduced.

Another advantage is that the occurrence of cracks in a light-emitting device is suppressed through a specified carrier concentration of the respective first and second n-type layers, in addition to reduction in the power consumption.

In a variation of the foregoing, the occurrence of cracks in a light-emitting device can be suppressed through a specified relationship in the layer thickness between the first and the second n-type layers.

In yet another variation, the occurrence of cracks can be effectively suppressed through a specified range of respective layer thickness values in the first and the second n-type layers. In addition, the depth of etching, when partially etching the p-type layer and the light-emitting layer off for having the surface of n-type layer exposed, can be maintained at a level of high precision.

Of course, it should be understood that a wide range of modifications can be made to the exemplary embodiments described above. It is therefore intended that the foregoing detailed description be regarded as illustrative rather than limiting and that it be understood that it is the following claims, including all equivalents, which are intended to define the scope of this invention.

What is claimed is:

1. A light-emitting gallium-nitride-group compound-semiconductor device having a stacked structure comprising:

a n-type layer formed on an insulating substrate, a portion of said n-type layer being exposed, an undoped light-emitting layer formed on said n-type layer, a p-type layer formed on said light-emitting layer, and an electrode formed on the exposed portion of said n-type layer, said n-type layer comprising a first n-type GaN layer and a second n-type GaN layer, said second n-type GaN layer having a carrier concentration that is higher than the carrier concentration of the first n-type layer and within the range of $2\times10^{18}$ cm$^{-3}$ to $1\times10^{19}$ cm$^{-3}$, said electrode being disposed on said second n-type GaN layer, said second n-type GaN layer being formed on an upper surface of said first n-type GaN layers wherein the thickness of said second n-type GaN layer is smaller than the thickness of said first n-type GaN layer.

2. The light-emitting gallium-nitride-group compound semiconductor device according to claim 1, wherein the thickness of said first n-type GaN layer falls within a range of 1–5 μm, the thickness of said second n-type GaN layer falls within a range of 0.1–0.5 μm.

* * * * *